United States Patent
Okandan et al.

(10) Patent No.: US 9,763,370 B2
(45) Date of Patent: Sep. 12, 2017

(54) APPARATUS FOR ASSEMBLY OF MICROELECTRONIC DEVICES

(71) Applicant: National Technology & Engineering Solutions of Sandia, LLC, Albuquerque, NM (US)

(72) Inventors: Murat Okandan, Edgewood, NM (US); Gregory N. Nielson, Albuquerque, NM (US); Jose Luis Cruz-Campa, Albuquerque, NM (US); Judith Maria Lavin, Albuquerque, NM (US); Paul J. Resnick, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 226 days.

(21) Appl. No.: 14/088,725

(22) Filed: Nov. 25, 2013

(65) Prior Publication Data

US 2014/0259633 A1    Sep. 18, 2014

Related U.S. Application Data

(60) Provisional application No. 61/791,143, filed on Mar. 15, 2013.

(51) Int. Cl.
*H05K 13/04* (2006.01)
*H01L 21/67* (2006.01)
(Continued)

(52) U.S. Cl.
CPC ....... *H05K 13/0478* (2013.01); *B65G 47/846* (2013.01); *B65G 47/847* (2013.01);
(Continued)

(58) Field of Classification Search
CPC .... H05K 13/0478; H05K 3/301; H05K 3/303; H01L 24/75; H01L 21/2007; H01L 31/022441; H01L 31/0516; H01L 31/062; H01L 31/188; H01L 24/81; H01L 2924/00; H01L 2924/12042; H01L 2924/12032; H01L 2924/1301; H01L 2924/13033;
(Continued)

(56) References Cited

U.S. PATENT DOCUMENTS 5,191,834 A    3/1993  Fuhrmann et al.
6,364,089 B1 *  4/2002  Singh .................. B65G 47/848
                                                198/403
(Continued)

FOREIGN PATENT DOCUMENTS

JP    2005335755 A  * 12/2005
WO   WO2004004025 A2    1/2001

OTHER PUBLICATIONS

International Search Report and Written Opinion for PCT/US2014/027508, dated Jul. 15, 2014.

*Primary Examiner* — A. Dexter Tugbang
(74) *Attorney, Agent, or Firm* — Martin I. Finston

(57) ABSTRACT

An apparatus including a carrier substrate configured to move a microelectronic device. The apparatus further includes a rotatable body configured to receive the microelectronic device. Additionally, the apparatus includes a second substrate configured to receive the microelectronic device from the rotatable body.

7 Claims, 6 Drawing Sheets

(51) Int. Cl.

| | |
|---|---|
| *B65G 47/84* | (2006.01) |
| *H05K 3/30* | (2006.01) |
| *H01L 21/20* | (2006.01) |
| *B65G 47/86* | (2006.01) |
| *H01L 21/677* | (2006.01) |
| *H01L 21/673* | (2006.01) |
| *H01L 23/00* | (2006.01) |
| *H01L 31/0224* | (2006.01) |
| *H01L 31/05* | (2014.01) |
| *H01L 31/068* | (2012.01) |
| *H01L 31/18* | (2006.01) |

(52) U.S. Cl.
CPC ........ *B65G 47/848* (2013.01); *H01L 21/2007* (2013.01); *H01L 21/673* (2013.01); *H01L 21/67132* (2013.01); *H01L 21/67242* (2013.01); *H01L 21/67796* (2013.01); *H01L 24/75* (2013.01); *H01L 24/81* (2013.01); *H01L 31/022441* (2013.01); *H01L 31/0516* (2013.01); *H01L 31/0682* (2013.01); *H01L 31/188* (2013.01); *H05K 3/301* (2013.01); *H05K 3/303* (2013.01); *H01L 2924/00* (2013.01); *H01L 2924/12032* (2013.01); *H01L 2924/12042* (2013.01); *H01L 2924/1301* (2013.01); *H01L 2924/1305* (2013.01); *H01L 2924/13033* (2013.01); *H01L 2924/13034* (2013.01); *H01L 2924/13055* (2013.01); *Y02E 10/547* (2013.01); *Y10T 29/49002* (2015.01); *Y10T 29/53174* (2015.01); *Y10T 29/53178* (2015.01); *Y10T 29/53191* (2015.01)

(58) Field of Classification Search
CPC . H01L 2924/13034; H01L 2924/13055; H01L 2924/1305; H01L 21/67132; H01L 21/67242; H01L 21/673; H01L 21/67796; H01L 31/0682; Y02E 10/547; Y10T 29/49002; Y10T 29/53174; Y10T 29/53191; Y10T 29/53178; B65G 47/846; B65G 47/847; B65G 47/848; B65G 53/00; B65G 53/02
See application file for complete search history.

(56) References Cited

U.S. PATENT DOCUMENTS

| | | | |
|---|---|---|---|
| 6,555,408 B1* | 4/2003 | Jacobsen | H01L 21/2007 257/E21.122 |
| 6,855,378 B1 | 2/2005 | Narang | |
| 6,932,136 B1* | 8/2005 | Kelkar | H01L 21/67132 156/716 |
| 2003/0140485 A1* | 7/2003 | Yamazaki | Y10T 29/53178 29/740 |
| 2004/0154161 A1* | 8/2004 | Aoyama | B65G 47/848 29/739 |
| 2006/0072295 A1 | 4/2006 | Gotzen | |
| 2008/0023296 A1 | 1/2008 | Aoyama et al. | |
| 2008/0222876 A1* | 9/2008 | Weber | H05K 3/303 29/592.1 |
| 2010/0018049 A1 | 1/2010 | Sakamoto et al. | |
| 2012/0321793 A1 | 12/2012 | Lundvall et al. | |

* cited by examiner

APPARATUS FOR ASSEMBLY OF MICROELECTRONIC DEVICES

CROSS-REFERENCE TO RELATED APPLICATIONS

The application claims the benefit of the earlier filing date of U.S. Provisional Patent Application No. 61/791,143, filed Mar. 15, 2013 and incorporated herein by reference.

GOVERNMENT RIGHTS

This invention was developed under Contract DE-AC04-94AL85000 between Sandia Corporation and the U.S. Department of Energy. The U.S. Government has certain rights in this invention.

FIELD OF THE INVENTION

The present invention relates in general to a process and system for placement of microelectronic devices on a variety of substrates, more specifically, for massively parallel placement of solar cells onto a module. Other embodiments are also described and claimed.

BACKGROUND

The adoption of photovoltaics for generating electricity from sunlight is largely driven by cost considerations. At present, photovoltaic systems are not competitive with fossil-fuel generated electricity. Thus, there is a need to reduce the overall photovoltaic system cost. In new developments of electronic components for consumer electronics, any cost saving measure is crucial for the competitiveness of the product. These factors entail reducing the costs associated with fabrication in both fields.

In solar photovoltaic (PV) panel production, the assembly of solar cells into a module is one of the key steps. Relatively small (500 micrometers or less) thin solar cells can be assembled into large arrays using mechanical and surface chemistry driven techniques. The details and associated cost of this assembly step is critical in determining the limitations of desirable solar cell size. For example, in pick-and-place assembly techniques, in which a machine is used to individually pick up, arrange and place each device on a substrate, the assembly costs are per device. When the assembly cost is per device, larger cell sizes (500 micrometers-1 mm) are desirable to reduce overall costs. Increasing cell sizes, however, increases the material costs and therefore offsets any reduction in assembly costs.

SUMMARY

A method, apparatus and system for massively parallel placement of microelectronic devices such as PV cells, detectors, integrated circuits and the like on a variety of substrates. In one embodiment, the devices are PV cells that are transferred onto a roller with pre-determined locations and deposited onto a receiving substrate using a "printing-like" technique. The cells can be placed onto the roller with the cell contacts facing into openings formed on the roller or with the contacts facing out. Depending on which orientation is used, a roller having a different pattern of openings and a different receiving substrate may be used. Once the cells are on the receiving substrate, conducting and insulating layers can be layered on the cells to provide the desired connectivity among the cells. In some embodiments, the conducting and insulating layers can also be patterned with openings to generate series and/or parallel combinations of cells to achieve a robust, high performance panel assembly of cells. For example, in cases where the contacts are facing out from the rollers, the conducting/insulating layers can be pre-patterned to match the electrical contacts on the cells. The insulating layers can be then slightly re-flown to infiltrate and fill up any voids that might remain in the assembly, which will improve the mechanical stability and reliability of the assembly. In some embodiments, the electrical contacts formed on the cells (e.g. top surface of the wafer) which need to be electrically separate are formed on different height surfaces, which will allow them to be contacted separated by other devices and/or circuitry.

In one embodiment, the method includes positioning a microelectronic device on a carrier substrate and coupling the microelectronic device to a roller assembly. Once coupled, the roller assembly is rotated to transport the microelectronic device from the carrier substrate to a receiving substrate.

In one embodiment, the system includes a carrier substrate configured to support a microelectronic device and a roller assembly configured to receive and transport the microelectronic device. The system further includes a receiving substrate dimensioned to receive the microelectronic device from the roller assembly.

In one embodiment, the apparatus for parallel assembly of microelectronic devices on a module may include a laterally translatable carrier substrate configured to move a plurality of microelectronic devices in a first direction. The apparatus may further include a rotatable cylindrical body having a plurality of device openings dimensioned to receive the microelectronic devices and a laterally translatable receiving substrate configured to move in a second direction.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

In this section we shall explain several preferred embodiments of this invention with reference to the appended drawings. Whenever the shapes, relative positions and other aspects of the parts described in the embodiments are not clearly defined, the scope of the invention is not limited only to the parts shown, which are meant merely for the purpose of illustration. Also, while numerous details are set forth, it is understood that some embodiments of the invention may be practiced without these details. In other instances, well-known structures and techniques have not been shown in detail so as not to obscure the understanding of this description.

Figure 1:
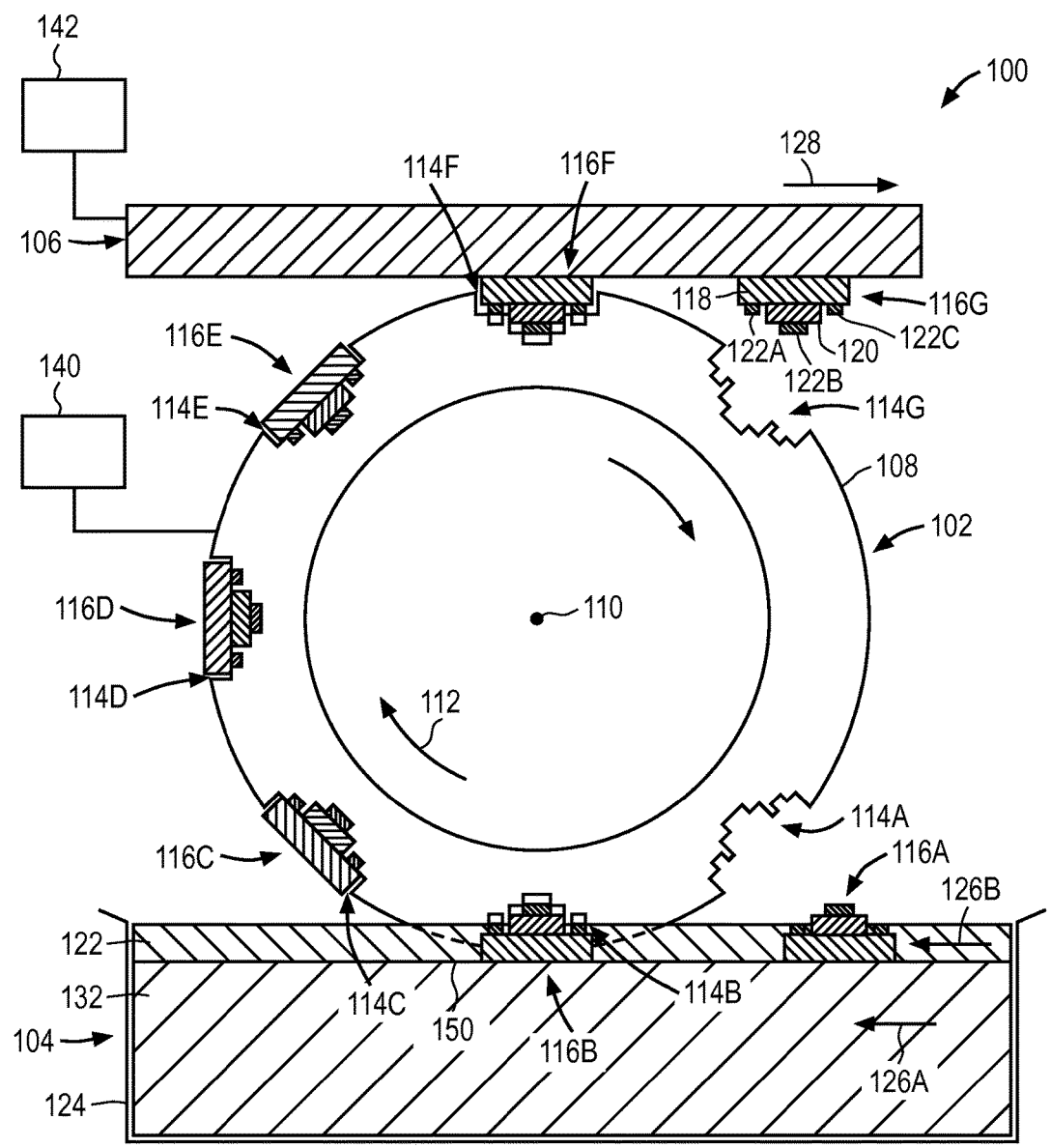
FIG. 1 schematically illustrates a cross-sectional side view of one embodiment of a microelectronic device transport system.

FIG. 1 schematically illustrates a cross-sectional side view of one embodiment of a microelectronic device transport system. In one embodiment, system 100 is a system capable of massively parallel placement of microelectronic devices on a variety of surfaces (e.g., substrates, panels, modules or the like). Representatively, system 100 is capable of picking up and transporting a plurality of microelectronic devices simultaneously from one substrate and placing them on another substrate for further processing.

In one embodiment, system 100 transports the plurality of microelectronic devices using a "printing-like" technique. In other words, system 100 may be configured to "print" the microelectronic devices onto a desired substrate. Representatively, system 100 may include a roller assembly 102, which is positioned between a carrier substrate 104 and a receiving substrate 106. Roller assembly 102 may include roller 108 which is similar to a gravure cylinder used in gravure printing. For example, roller 108 may be a metal (e.g. steel) or rubber cylinder which can be engraved or otherwise machined to include a desired pattern along its outer surface. The pattern allows for roller 108 to pick up microelectronic devices and "print" (i.e. place) the devices onto another surface. In this aspect, roller 108 may be assembled within system 100 such that it can rotate around a central axis 110. In some embodiments, central axis 110 may be a fixed axis such that roller 108 remains in the same lateral position while rotating. For example, in one embodiment, roller 108 may rotate about axis 110 in a clockwise direction as illustrated by arrow 112. Roller 108 may, however, be movable in a vertical direction to allow for vertical positioning of roller 108 within system 100. Alternatively, roller 108 may be fixed in both a lateral and a vertical direction, or movable in one or both directions. Rotation of roller 108 may be driven by an actuating mechanism 140, such as, for example, a motor assembly or any similar actuating mechanism capable of driving rotation of an associated roller.

Roller 108 may be positioned between carrier substrate 104 and receiving substrate 106 and include device openings 114A, 114B, 114C, 114D, 114E, 114F and 114G along its outer surface. Device openings 114A, 114B, 114C, 114D, 114E, 114F and 114G may be dimensioned to receive microelectronic devices 116A, 116B, 116C, 116D, 116E, 116F and 116G, respectively. Representatively, in embodiments where microelectronic devices 116A-116G are photovoltaic solar cells, device openings 114A-114G may be recessed regions within the surface of roller 108 which have a similar shape to photovoltaic solar cells such that the cells can be received therein. For example, in the illustrated embodiment, microelectronic device 116G is a multilayer photovoltaic solar cell including a substrate layer 118, an insulator 120 formed on the substrate layer 118 and contact pads 122A, 122B and 122C formed on the substrate layer 118 and insulator 120. The remaining microelectronic devices 116A-116F may have similar features. Device openings 114A-114G may therefore have a size and shape matching the profile of each of the multilayered microelectronic devices 116A-116G. Device openings 114A-114G may, however, have a size and shape similar to, and capable of receiving, other types of microelectronic devices, for example, a detector device, an integrated circuit device or the like.

Device openings 114A-114G may be formed within a surface of roller 108 according to any conventional processing technique capable of forming micro-scale recesses (e.g. 1 mm or less) within a surface of roller 108, for example, machining, laser imprinting, engraving, patterning, etching, or the like. It is further to be understood that although 7 device openings 114A-114G are illustrated, any number of device openings, and in any desired spacing, may be formed around the outer surface of roller 108.

Figure 2:
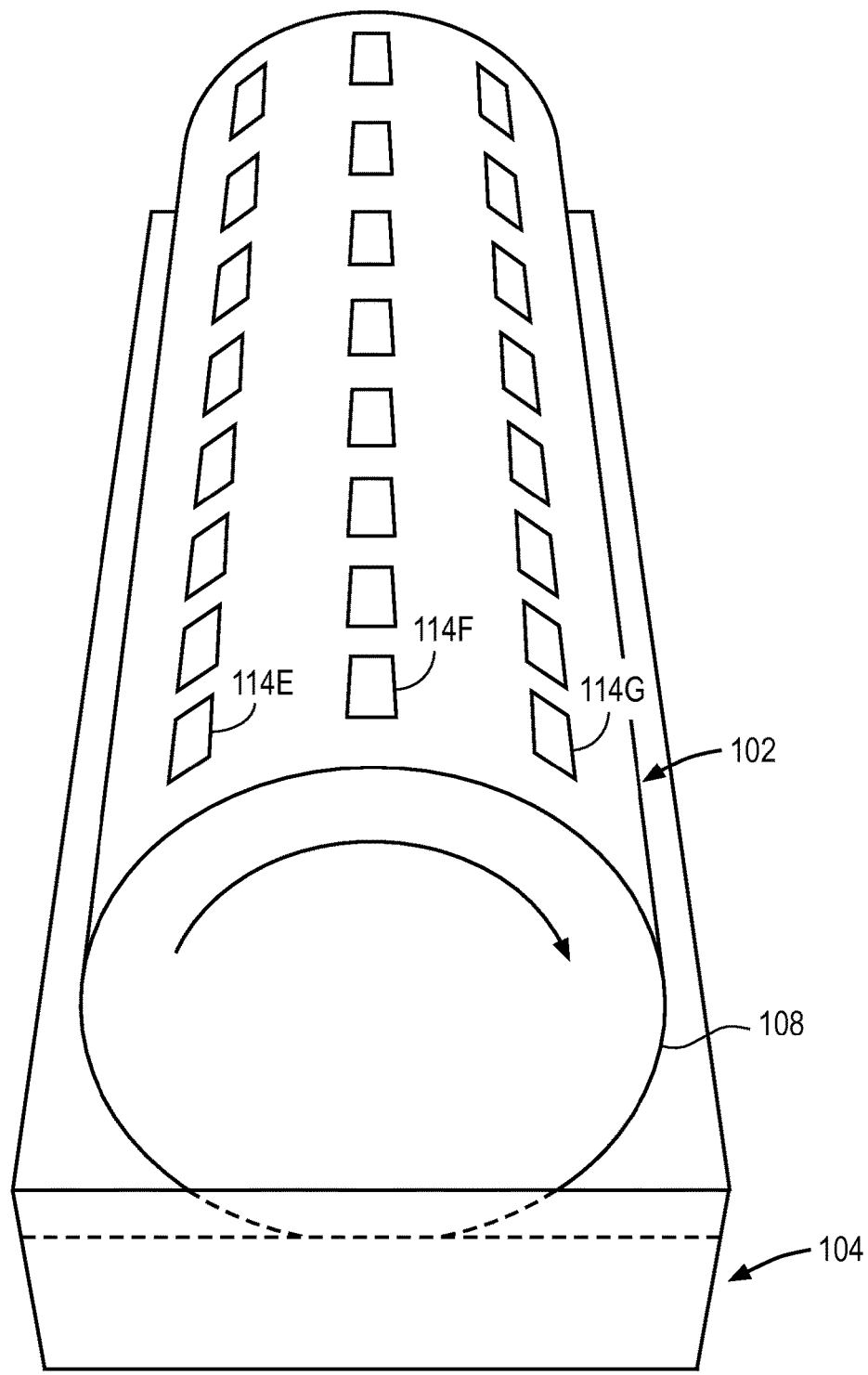
FIG. 2 schematically illustrates a front perspective view of the system of FIG. 1.

In addition, it is to be understood that roller 108 is an elongated cylinder and includes multiple device openings along its length, as shown in FIG. 2. In particular, FIG. 2 illustrates a front perspective view of system 100, with carrier substrate 104 and microelectronic devices 116A-116G removed for ease of illustration. From this view, it can be seen that roller 108 includes an array of device openings, including openings 114A-114G (some not shown), positioned around the circumference of roller 108 and extending along its length from one end to the other. Thus, it is to be understood that any number and arrangement of device openings may be formed in roller 108. In one embodiment, the number and/or arrangement of device openings may be determined based on the desired number and/or arrangement of microelectronic devices on the receiving substrate. For example, where the microelectronic devices are desired to be distributed onto the receiving substrate in a specific pattern, roller 108 may have device openings which match the desired pattern and therefore pick up the microelectronic devices and distribute them in the desired pattern on the receiving substrate. As such, the number and/or arrangement of device openings is only constrained by the number of microelectronic devices desired to be picked up and transported by roller 108. In addition, although not shown, additional microelectronic devices, similar to microelectronic devices 116A-116G may be dispersed along the entire length and width of carrier substrate 104 such that they are spread out along the length of roller 108 and can be received by any of the device openings they may come in contact with.

Returning to FIG. 1, as previously discussed, roller 108 is positioned between carrier substrate 104 and receiving substrate 106. The relative position between 104 and 106 can be parallel or not. Carrier substrate 104 may be any type of substrate capable of aligning one or more of microelectronic devices 116A-116G such that a face of the devices 116A-116G (e.g. substrate side or contact side) faces roller 108. Representatively, in one embodiment, carrier substrate 104 is formed by a first fluid layer 132 and a second fluid layer 122 held within basin 124. First fluid layer 120 and second fluid layer 122 may be made of any types of fluids which are immiscible with respect to one another such that one layer remains separate from the other. Representatively, second fluid layer 122 may be made of a material which forms a fluid layer on top of first fluid layer 132. Representative materials for first fluid layer 132 and second fluid layer 122 may include materials having different densities, for example, first fluid layer 132 may be water and second fluid layer 122 may be oil. In some embodiments, first fluid layer 132 is made of a material that is more dense than second fluid layer 122 such that first fluid layer 132 forms below second fluid layer 122. The only constraint of the specific materials selected for each of fluid layers 122, 132 is that the material for each be one which is compatible with the microelectronic devices that may be aligned therein and one that will not impact any subsequent processing steps.

Representatively, regarding alignment of the microelectronic devices, due to the immiscibility of first fluid layer 132 and second fluid layer 122, the fluid layers may form a boundary 150 which forces the microelectronic devices (e.g. devices 116A, 116B) to arrange themselves in a desired orientation. The desired orientation may be with contact pads 122A-122C facing roller 108, or substrate layer 118 facing roller. For example, in the illustrated embodiment, contact pads 122A-122C are aligned by first fluid layer 132 and second fluid layer 122 such that they face roller 108. Such alignment may be achieved where, for example, first fluid layer 132 is a hydrophilic fluid (e.g. water) and second fluid layer 122 is hydrophobic (e.g. silicon oil). In this aspect, since the substrate layer 118 is hydrophilic, it is drawn to, and aligns itself with, the hydrophilic first fluid layer 132 such that contact pads 122A-122C face roller 108.

The microelectronic devices 116A-116G may initially be deposited onto carrier substrate 104 from the substrate on which they are formed by any standard release technique. For example, microelectronic devices 116A-116G may be formed as an array of microelectronic devices on a substrate. Once formed, microelectronic devices 116A-116G may be transferred from the substrate on which they are formed to carrier substrate 104 by releasing them from the substrate using, for example, a chemical release process such as etching or a mechanical separation. Alternatively, microelectronic devices 116A-116G may be held onto the substrate by an adhesive or the like which will dissolve or otherwise release microelectronic devices 116A-116G into carrier substrate 104 once submerged within first fluid layer 132 and/or second fluid layer 122. In this aspect, microelectronic devices 116A-116C are deposited onto carrier substrate 104 by simply submerging the microelectronic devices 116A-116G and associated substrate into first fluid layer 132 and/or second fluid layer 122. Once released into first fluid layer 132 and second fluid layer 122, microelectronic devices 116A-116G will orient themselves in the desired manner as previously discussed. In other embodiments, microelectronic devices 116A-116G may be singular devices which are already free floating within a carrier fluid. In this case, microelectronic devices 116A-116G may be picked and placed into carrier substrate 104 or dumped into carrier substrate 104 from the carrier fluid.

Carrier substrate 104 is further configured such that it is laterally translatable and can move any microelectronic devices positioned therein toward roller 108. Representatively, first fluid layer 132 and second fluid layer 122 may flow in a direction of roller 108 as illustrated by arrows 126A and 126B. The fluid within the first fluid layer 132 and the second fluid layer 122 may be caused to flow by, for example, a pump, stirring bar or other mechanism capable of generating a current in the desired direction (e.g. in the direction of arrows 126). In this aspect, microelectronic devices 116A-116G are continuously drawn toward and under roller 108 such that as roller 108 rotates, microelectronic devices 116A-116G become aligned within an open device opening (e.g. device opening 114A). Once aligned, one or more of the microelectronic devices (e.g. microelectronic device 116B) are drawn into the device opening (e.g. device opening 114B) and remain attached to roller 108 as roller 108 rotates about axis 110. Attachment of the microelectronic devices within the respective device opening may be achieved by any suitable mechanism. Representatively, frictional forces, electrostatic forces, capillary forces, vacuum forces, adhesive forces, or the like, may provide the force used to hold the devices within the desired openings. For example, in the case of vacuum forces, one or more of the device openings may include channels, which are formed during formation of the openings (e.g. etching) and are coupled to a vacuum source such that a vacuum force capable of drawing devices into the openings can be created.

Once microelectronic devices 116A-116G are within device openings 114A-114G, they are transported to receiving substrate 106 via rotation of roller 108. Receiving substrate 106 can be any type of receiving surface where microelectronic devices 116A-116G are desired to be deposited. For example, receiving substrate 106 could be a final assembly substrate (e.g. module or panel) where microelectronic devices will remain once deposited, or receiving substrate 106 could be a carrier substrate that receives microelectronic devices 116A-116G prior to depositing them onto a further receiving substrate.

Microelectronic devices 116A-116G are released onto receiving substrate 106 once they reach the top of roller 108 as illustrated in FIG. 1. To facilitate release and transport of microelectronic devices 116A-116G, receiving substrate 106 may be laterally translatable in a direction away from roller 108, as illustrated by arrow 128. The direction of movement of receiving substrate 106 may, in some embodiments, be opposite that of carrier substrate 120. Movement of receiving substrate 106 may be driven by for example, an actuating mechanism 142, such as, for example, a conveyor belt assembly or any similar actuating mechanism capable of moving a substrate positioned thereon in the desired direction.

In addition, a surface of receiving substrate 106 may include an adhesive or the like which applies a force greater than that of device openings 114A-114G to microelectronic devices 116A-116G. Since the force of receiving substrate 106 is greater than that of device openings 114A-114G, once microelectronic devices 116A-116C contact receiving substrate 106, they are pulled out of device openings 114A-114G by receiving substrate 106. Microelectronic devices 116A-116C may then remain attached to receiving substrate 106, or subsequently removed and transported to a final receiving surface.

Figure 3:
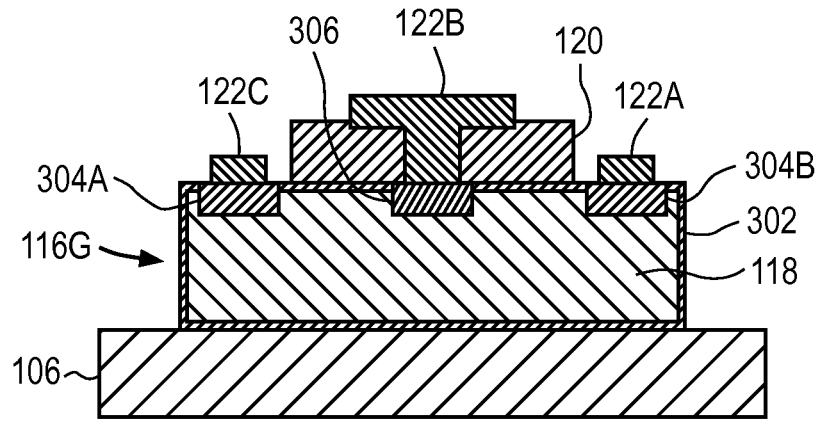
FIG. 3 schematically illustrates a cross-sectional side view of a microelectronic device on a substrate.

FIG. 3-FIG. 8 illustrate further processing steps which may be performed on one or more of the microelectronic devices 116A-116G once they are deposited (or "printed") on receiving substrate 106. Representatively, FIG. 3 illustrates a magnified view of microelectronic device 116G attached to receiving substrate 106, as shown in FIG. 1. From this view, it can be seen that microelectronic device 116G may be a single junction type photovoltaic cell which further includes an insulating layer 302 surrounding substrate 118, as well as junction regions 304A, 304B and 306. In one embodiment, junction regions 304A and 304B are, for example, p⁺ junction regions and junction region 306 is an n⁺ junction region. Alternatively, junction regions 304A and 304B may be, for example, n⁺ junction regions and junction region 306 may be a p⁺ junction region. Microelectronic device 116G may be formed by any standard processing technique used to form a photovoltaic cell having the features described herein. In one embodiment, microelectronic device 116G may be as small as 10 micrometers across and 1 micrometer thick to 100 s of micrometers across and 40-50 micrometers thick. It is further noted that since contact pads 122A-122C are formed on different height surfaces, they can be contacted separately by other devices, as will be described in more detail below. In addition, where microelectronic device 116G is a photovoltaic cell, light input occurs on the side of substrate 118.

Figure 4:
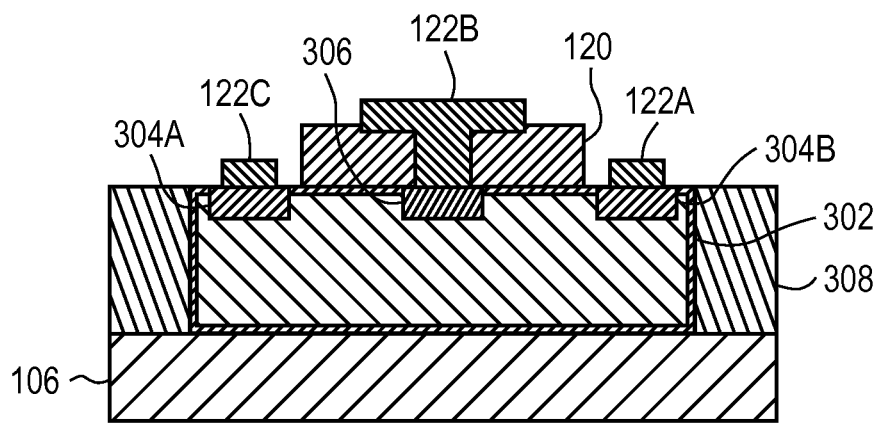
FIG. 4 schematically illustrates a cross-sectional side view of the microelectronic device of FIG. 3 after application of an insulating layer.

FIG. 4 schematically illustrates a cross-sectional side view of the microelectronic device of FIG. 3 after application of an insulating layer. Representatively, insulating layer 308 may be a silicone, polymer, or any other insulating material which is applied over microelectronic device 116G using any standard processing technique. Although a single microelectronic device 116G is illustrated, it is to be understood that insulating layer 308 may be applied on a plurality of microelectronic devices, including device 116G, which may be positioned on receiving substrate 106. In this aspect, insulating layer 308 settles into recesses between each device to form an insulating layer there between. In some embodiments, the amount of insulating material applied is any amount suitable to form an insulating layer having a similar thickness as substrate 118.

Figure 5:
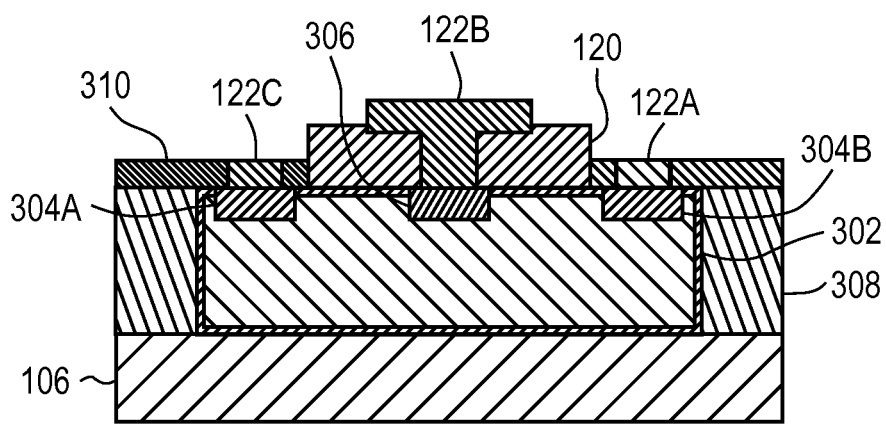
FIG. 5 schematically illustrates a cross-sectional side view of the microelectronic device of FIG. 4 after application of a conductive layer.

FIG. 5 schematically illustrates a cross-sectional side view of the microelectronic device of FIG. 4 after application of a conductive layer. Following application of insulating layer 308, conductive layer 310 is applied such that a layer of conductive material is formed over the insulating layer 308 and in contact with contact pads 122A and 122C. In this aspect, conductive layer 310 may be used to electrically connect other devices and/or circuitry to contact pads 122A and 122C. Conductive layer 310 may be applied according to any standard processing technique suitable for forming a conductive layer 310 having a thickness which covers contact pads 122C and 122A (e.g. a deposition process). Representative materials for forming conductive layer 310 may include, but are not limited to, metal materials such as copper or aluminum.

Figure 6:
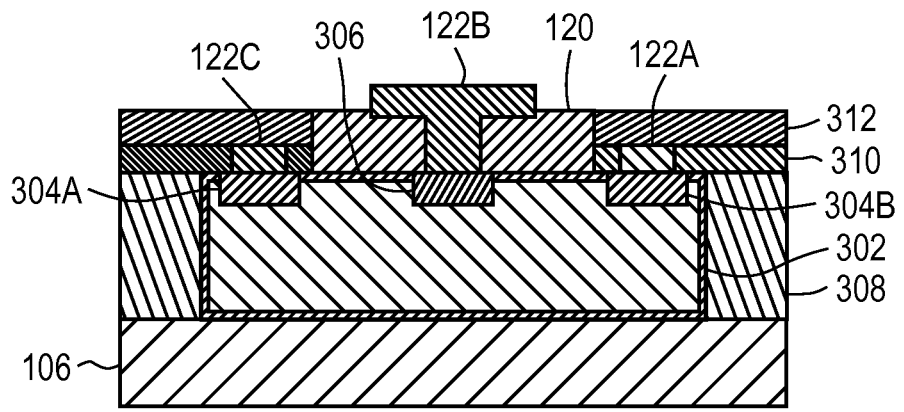
FIG. 6 schematically illustrates a cross-sectional side view of the microelectronic device of FIG. 5 after application of an insulating layer.

FIG. 6 schematically illustrates a cross-sectional side view of the microelectronic device of FIG. 5 after application of an insulating layer. Once conductive layer 310 is formed, a further insulating layer 312 may be formed over conductive layer 310. Insulating layer 312 may be made of a similar material and formed in a similar manner as insulating layer 308. Insulating layer 312 may be deposited in an amount such that it is level with insulator 120.

Figure 7:
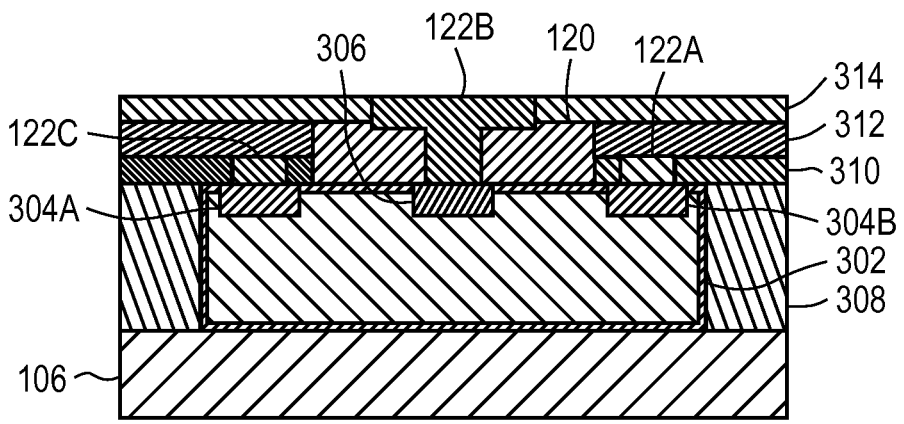
FIG. 7 schematically illustrates a cross-sectional side view of the microelectronic device of FIG. 6 after application of a conductive layer.

FIG. 7 schematically illustrates a cross-sectional side view of the microelectronic device of FIG. 6 after application of a conductive layer. A further conductive layer 314 is formed over insulating layer 312 such that it covers contact pad 122B. Conductive layer 314 may be made of a similar material and formed in a similar manner as conductive layer 310 except that in this embodiment, it has a thickness sufficient to surround contact pad 122B. Since conductive layer 310 and conductive layer 314 are in separate layers and in contact with contact pads in the different layers of microelectronic device 116G, the contact pads can be separately connected to different devices and/or circuitry.

Figure 8:
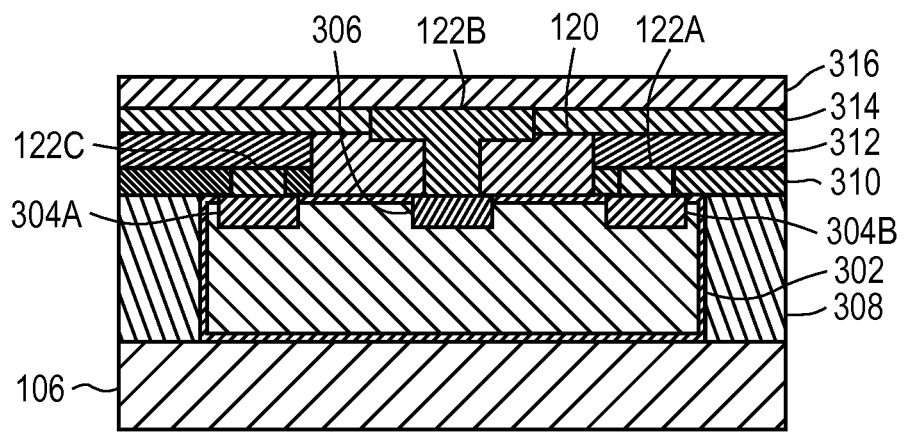
FIG. 8 schematically illustrates a cross-sectional side view of the microelectronic device of FIG. 7 after application of an insulating layer.

FIG. 8 schematically illustrates a cross-sectional side view of the microelectronic device of FIG. 7 after application of an insulating layer. A further insulating layer 316 is formed over conductive layer 314 to form an insulating cap over the entire structure. Insulating layer 316 may be formed of a similar material and in a similar manner to that of insulating layers 308 and 312. Once insulating layer 316 is formed, the device is ready for integration within a desired system, e.g. electrical connection with other devices or circuitry for delivery of, for example, solar power or data within the desired system.

Figure 9:
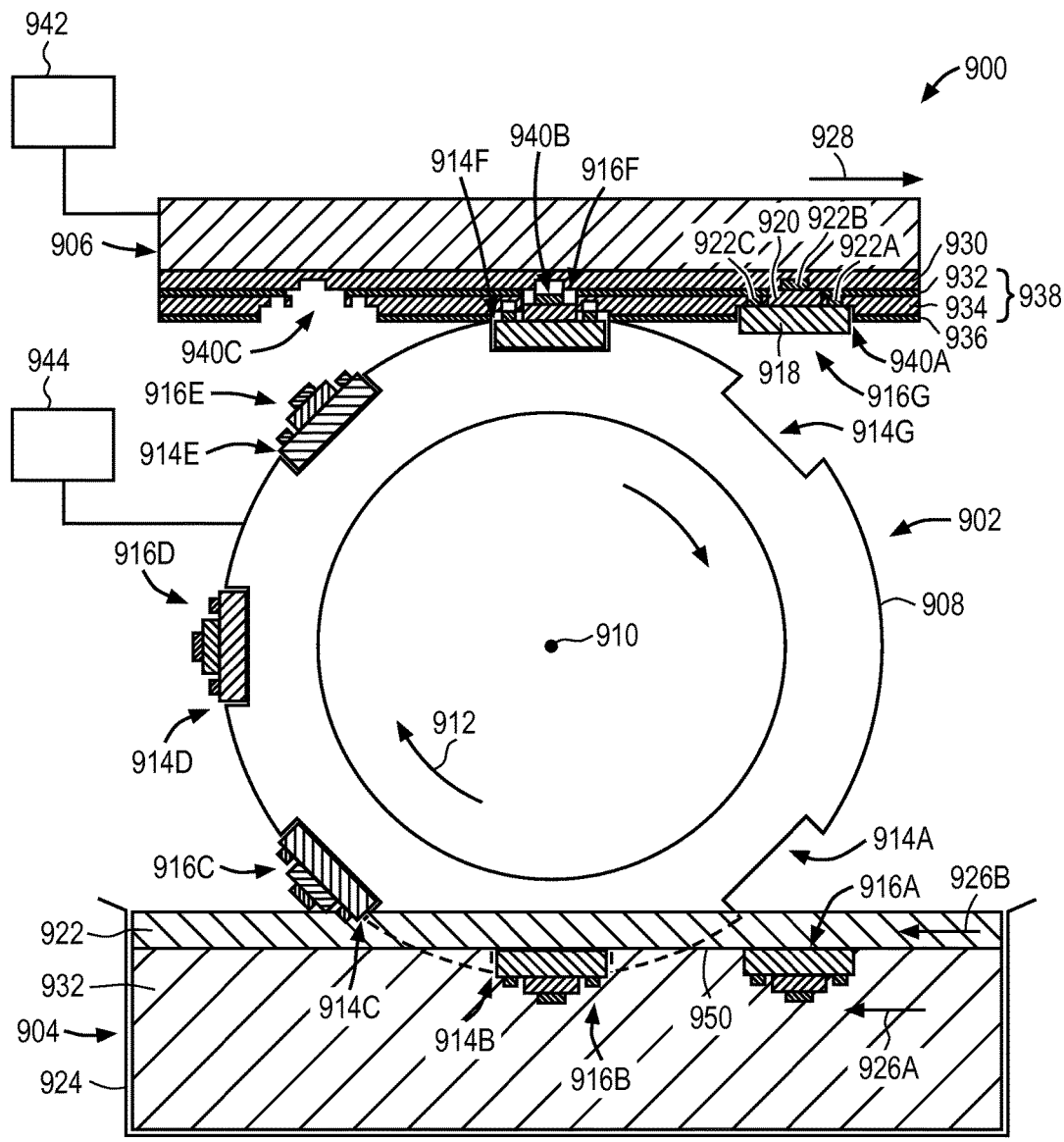
FIG. 9 schematically illustrates a cross-sectional side view of another embodiment of a microelectronic device transport system.

FIG. 9 schematically illustrates a cross-sectional side view of another embodiment of a microelectronic device transport system. In one embodiment, system 900 is a system similar to system 100 in that it is capable of massively parallel placement of microelectronic devices on a variety of substances. Representatively, system 900 is capable of picking up and transporting a plurality of microelectronic devices from one substrate and placing them on another substrate for further processing. Unlike system 100, however, system 900 transports the microelectronic devices such that their contact surfaces align with pre-patterned insulating and conducting regions formed on the receiving substrate.

In one embodiment, system 900 transports the plurality of microelectronic devices using a "printing-like" technique. In other words, system 900 may be configured to "print" (or place) the microelectronic devices simultaneously onto a desired substrate. Representatively, system 900 may include a roller assembly 902, which is positioned between a carrier substrate 904 and a receiving substrate 906. Roller assembly 902 may include roller 908 which is substantially similar to roller 108 described in reference to FIG. 1. For example, roller 908 may be a metal (e.g. steel) or rubber cylinder which can be engraved or otherwise machined to include a desired pattern along its outer surface. The pattern allows for roller 908 to pick up microelectronic devices and "print" the devices onto another surface. In this aspect, roller 908 may be assembled within system 900 such that it can rotate around a central axis 910. In some embodiments, central axis 910 may be a fixed axis such that roller 908 remains in the same lateral position while rotating. For example, in one embodiment, roller 908 may rotate about axis 910 in a clockwise direction as illustrated by arrow 912. Roller 908 may, however, be movable in a vertical direction to allow for vertical positioning of roller 908 within system 900. Alternatively, roller 908 may be fixed in both a lateral and a vertical direction, or movable in one or both directions. Rotation of roller 908 may be driven by an actuating mechanism 944, such as, for example, a motor assembly or any similar actuating mechanism capable of driving rotation of an associated roller.

Roller 908 may be positioned between carrier substrate 904 and receiving substrate 906 and include device openings 914A, 914B, 914C, 914D, 914E, 914F and 914G along its outer surface. Device openings 914A, 914B, 914C, 914D, 914E, 914F and 914G may be dimensioned to receive microelectronic devices 916A, 916B, 916C, 916D, 916E, 916F and 916G, respectively. Representatively, in embodiments where microelectronic devices 116A-116G are photovoltaic solar cells, device openings 914A-914G may be recessed regions within the surface of roller 908 which have a similar shape to photovoltaic solar cells such that the cells can be received therein. For example, in the illustrated embodiment, microelectronic device 916G is a multilayer photovoltaic solar cell including a substrate layer 918, an insulator 920 formed on the substrate layer 918 and contact pads 922A, 922B and 922C formed on the substrate layer 918 and insulator 920. The remaining microelectronic devices 916A-916F may have similar features. Device openings 914A-914G may therefore have a size and shape matching the profile of each of the multilayered microelectronic devices 916A-916G. In this embodiments, the device openings 914A-914G have a size and shape to match a profile of substrate layer 918 (e.g. a substantially rectangular profile). Device openings 914A-914G may, however, have a size and shape similar to, and capable of receiving, other types of microelectronic devices, for example, a detector device, an integrated circuit device or the like. Device openings 914A-914G may be formed within a surface of roller 908 according to any conventional processing technique capable of forming micro-scale recesses within a surface of roller 908, for example, machining, laser imprinting, engraving, patterning, etching, or the like. It is further to be understood that although 7 device openings 914A-914G are illustrated, any number of device openings, and in any desired spacing, may be formed around the outer surface of roller 908.

In addition, it is to be understood that roller 908 is an elongated cylinder similar to roller 108 described in reference to FIG. 1 and FIG. 2 such that it includes multiple device openings along its length. In this aspect, roller 908 may include an array of device openings, including openings 914A-914G, positioned around the circumference of roller 908 and extending along its length from one end to the other. Thus, it is to be understood that any number and arrangement of device openings may be formed in roller 908. In one embodiment, the number and/or arrangement of device openings may be determined based on the desired number and/or arrangement of microelectronic devices on the receiving substrate. For example, where the microelectronic devices are desired to be distributed onto the receiving substrate in a specific pattern, roller 908 may have device openings which match the desired pattern and therefore pick up the microelectronic devices and distribute them in the desired pattern on the receiving substrate. As such, the number and/or arrangement of device openings is only constrained by the number of microelectronic devices desired to be picked up and transported by roller 908. In addition, although not shown, additional microelectronic devices, similar to microelectronic devices 916A-916G may be dispersed along the entire length and width of carrier substrate 904 such that they are spread out along the length of roller 908 and can be received by any of the device openings they may come in contact with.

Roller 908 is positioned between carrier substrate 904 and receiving substrate 906. Carrier substrate 904 may be substantially similar to carrier substrate 104 described in reference to FIG. 1. Representatively, in one embodiment, carrier substrate 904 is formed by a first fluid layer 932 and a second fluid layer 922 held within basin 924. First fluid layer 932 and second fluid layer 922 may be made of any types of fluids which are immiscible with respect to one another such that one layer remains separate from the other. Representatively, first fluid layer 932 may be made of a material which forms a base fluid layer and second fluid layer 922 may be a material which forms a fluid layer on top of first fluid layer 932. Representative materials for first fluid layer 932 and second fluid layer 922 may include materials having different densities, for example, first fluid layer 932 may be water and second fluid layer 922 may be oil. In some embodiments, first fluid layer 932 is more dense than second fluid layer 922. The only constraint of the specific materials selected for each of fluid layers 920, 922 is that the material be one which is compatible with the microelectronic devices that may be aligned therein and one that will not impact any subsequent processing steps.

Representatively, regarding alignment of the microelectronic devices, due to the immiscibility of first fluid layer 932 and second fluid layer 922, the fluid layers may form a boundary 950 which forces the microelectronic devices (e.g. devices 916A, 916B) to arrange themselves in a desired orientation. The desired orientation may be with substrate layer 918 facing roller 908. Such alignment may be achieved where, for example, first fluid layer 932 is water and second fluid layer 922 is toluene or oil. In this aspect, since the substrate layer 918 is hydrophilic, substrate layer 918 aligns with boundary 950 and faces roller 108. Other materials may, however, be used to achieve such alignment.

The microelectronic devices 916A-916G may initially be deposited onto carrier substrate 904 from the substrate on which they are formed by any standard release technique. For example, microelectronic devices 916A-916G may be formed as an array of microelectronic devices on a substrate. Once formed, microelectronic devices 916A-916G may be transferred from the substrate on which they are formed to carrier substrate 904 by releasing them from the substrate using, for example, a chemical release process such as etching or a mechanical separation. Alternatively, microelectronic devices 916A-916G may be held onto the substrate by an adhesive or the like which will dissolve or otherwise release microelectronic devices 916A-916G into carrier substrate 904 once submerged within first fluid layer 932 and/or second fluid layer 922. In this aspect, microelectronic devices 916A-916C are deposited into carrier substrate 904 by simply submerging the microelectronic devices 916A-916G and associated substrate into first fluid layer 932 and/or second fluid layer 922. Once released into first fluid layer 932 and second fluid layer 922, microelectronic devices 916A-916G will orient themselves in the desired manner as previously discussed. In other embodiments, microelectronic devices 916A-916G may be singular devices which are already free floating within a carrier fluid. In this case, microelectronic devices 916A-916G may be picked and placed into carrier substrate 904 or dumped into carrier substrate 904 from the carrier fluid.

Carrier substrate 904 is further configured such that it is laterally translatable and can move the microelectronic devices positioned therein toward roller 908. Representatively, first fluid layer 932 and second fluid layer 922 may flow in a direction of roller 908 as illustrated by arrows 926. The fluid within the first fluid layer 932 and the second fluid layer 922 may be caused to flow by, for example, a pump, stirring bar or other mechanism capable of generating a current in the desired direction (e.g. in the direction of arrows 926A and 926B). In this aspect, microelectronic devices 916A-916G are continuously drawn toward and under roller 908 such that as roller 908 rotates, microelectronic devices 916A-916G become aligned within an open device opening (e.g. device opening 914A). Once aligned, one or more of the microelectronic devices (e.g. microelectronic device 916B) are drawn into a device opening (e.g. device opening 914B) and remain attached to roller 908 as roller 908 rotates about axis 910. Attachment of the microelectronic devices within the respective device opening may be achieved by any suitable mechanism. Representatively, frictional forces, electrostatic forces, capillary forces, vacuum forces, adhesive forces, or the like, may provide the force used to hold the devices within the desired openings. For example, in the case of vacuum forces, one or more of the device openings may include channels, which are formed during formation of the openings (e.g. etching) and are coupled to a vacuum source such that a vacuum force capable of drawing devices into the openings can be created.

Once microelectronic devices 916A-916G are within devices openings 914A-914G, they are transported to receiving substrate 906 via rotation of roller 908. Receiving substrate 906 can be any type of receiving surface where microelectronic devices 916A-916G are desired to be deposited. For example, receiving substrate 906 could be a final assembly substrate where microelectronic devices will remain once deposited, or receiving substrate 906 could be a carrier substrate that receives microelectronic devices 916A-916G prior to depositing them onto a further receiving substrate.

Microelectronic devices 916A-916G are released onto receiving substrate 906 once they reach the top of roller 908 as illustrated in FIG. 9. To facilitate release and transport of microelectronic devices 916A-916G, receiving substrate 906 is laterally translatable in a direction away from roller 908, as illustrated by arrow 928. The direction of movement of receiving substrate 906 may, in some embodiments, be opposite that of carrier substrate 904. Movement of receiving substrate 906 may be driven by for example, an actuating mechanism 942, such as, for example, a conveyor belt assembly or any similar actuating mechanism capable of moving a substrate positioned thereon in the desired direction.

In the illustrated embodiment, receiving substrate 906 includes a patterned layer 938 formed on receiving substrate 906, which is pre-patterned to have patterned openings 940A, 940B and 940C in a shape of microelectronic devices 916A-916G. In some embodiments, patterned layer 938 is a multilayered structure having alternating insulating and conductive layers. Representatively, receiving substrate 906 may include conductive layer 930 formed on receiving substrate 906, insulating layer 932 formed on conductive layer 930, conductive layer 934 formed on insulating layer 932 and insulating layer 936 formed on conductive layer 936. Patterned layer 938 may be patterned such that patterned openings 940A, 940B and 940C have a similar shape and profile as the contact side of microelectronic devices 916A-916G. In this aspect, patterned openings 940A, 940B and 940C may be patterned to have a stepped pattern such that conductive layer 934 aligns with contact pads 922A, 922C and conductive layer 930 aligns with contact pad 922B. In this aspect, conductive layers 930 and 934 may be used to separately connect contact pads 922A, 922C and 922B to a desired device (e.g. another microelectronic device or other circuitry for transfer of power or data).

Patterning of openings 940A-940C may be achieved according to any known microelectronic device processing technique capable of forming micro-scale recesses (e.g. 1 mm or less) within a substrate, for example, machining, laser imprinting, engraving, patterning, etching, or the like.

Once positioned within patterned openings 940A-940C of receiving substrate 906, microelectronic devices 916A-916C may then remain attached to receiving substrate 906 for electrical connection to other devices, or subsequently removed and transported to a final receiving surface.

Figure 10:
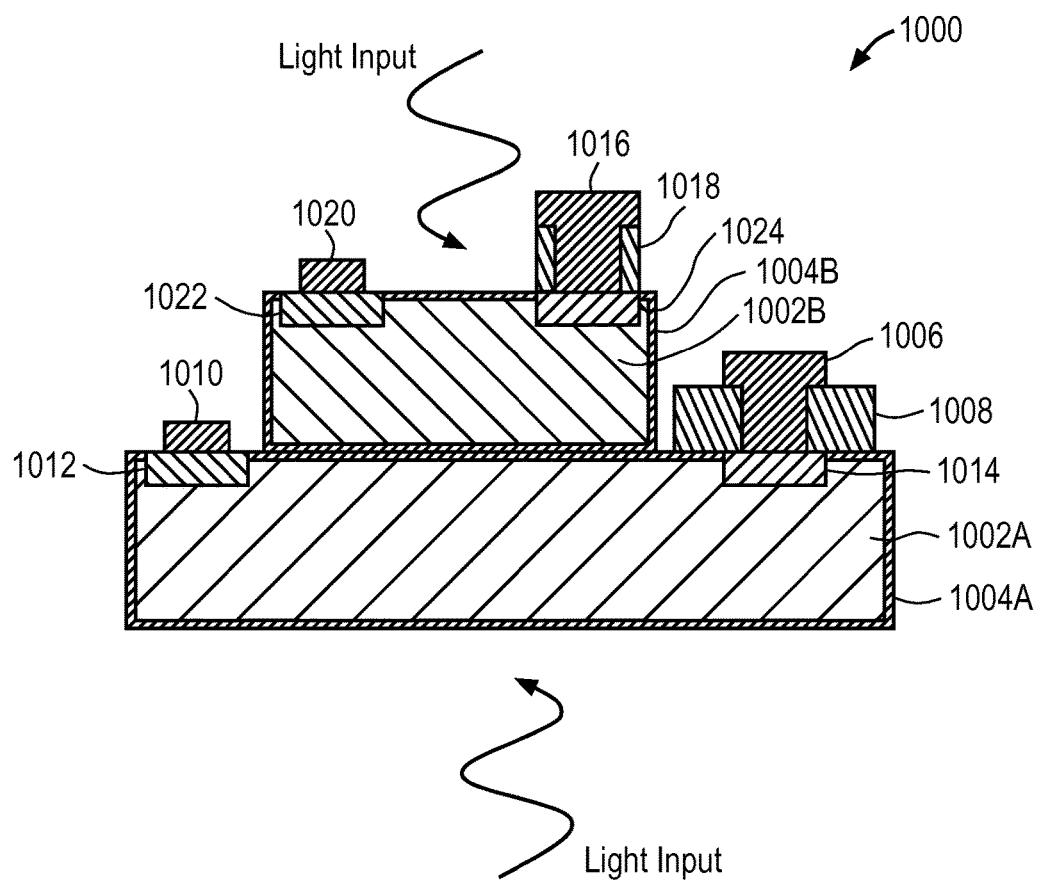
FIG. 10 schematically illustrates a cross-sectional side view of one embodiment of a microelectronic device.

FIG. 10 schematically illustrates a cross-sectional side view of another embodiment of a microelectronic device. Similar to the previously discussed microelectronic devices 116A-116G and 916A-916G, microelectronic device 1000 is a multilayered device, except in this embodiment, microelectronic device 1000 includes a second semiconductor layer having an additional contact pad. Representatively, microelectronic device 1000 may be a photovoltaic cell of a multi-junction cell type which can receive light input from two sides. In this aspect, microelectronic device 1000 may include a first substrate layer 1002A surrounded by a first insulating layer 1004A and a second substrate layer 1002B surrounded by a second insulating layer 1004B, with the second substrate layer 1002B being stacked on top of the first substrate layer 1002A. First substrate layer 1002A may include a contact pad 1006 surrounded by an insulating layer 1008 and another contact pad 1010. Each of contact pads 1006 and 1010 may be connected to junction regions 1014 and 1012, respectively. Second substrate layer 1002B may further include contact pad 1016 surrounded by insulating layer 1018 and contact pad 1020. Each of contact pads 1016 and 1020 may be connected to junction regions 1024 and 1022, respectively. As previously discussed, microelectronic device 1000 may receive light input from both substrate sides. It is further to be understood that, although not illustrated, any of the previously discussed transport systems 100 and 900 may be configured to transport multi-junction cell type of device 1000. In such cases, the only difference between systems 100 and 900 would be that the device openings and patterned openings would be shaped and sized to conform to the multi leveled structure of device 1000.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. For example, although a carrier substrate is described as including fluid layers, it is further contemplated that the carrier substrate may be made of any material(s) capable of carrying and transporting the microelectronic devices as described herein. Representatively, the carrier substrate may be made of a single fluid layer or a solid laterally translatable substrate material that can transport microelectronic devices in a direction of the roller assembly as previously discussed. In addition, although microelectronic devices such as PV cells are described herein, other types of devices are contemplated, including, but not limited to, DIACs, diodes (rectifier diode), gunn diodes, IMPATT diodes, laser diodes, light-emitting diodes (LED), photocells, PIN diodes, schottky diodes, tunnel diodes, VCSELs, VECSELs, zener diodes, bipolar transistors, darlington transistors, field-effect transistors, insulated-gate bipolar transistor (IGBT)s, silicon controlled rectifiers, thyristors, TRIACs, unijunction transistors, hall effect sensors (magnetic field sensor), integrated circuits (ICs), charge-coupled devices (CCD), microprocessor devices, random-access memory (RAM) devices, or read-only memory (ROM) devices. The description is thus to be regarded as illustrative instead of limiting.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations that have been shown without detail in order to avoid obscuring the understanding of the description. Where considered appropriate, reference numerals or terminal portions of reference numerals have been repeated in the figure to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description, various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. An apparatus for parallel assembly of microelectronic devices on a module comprising:
   a laterally translatable carrier substrate configured to move a plurality of microelectronic devices in a first direction;
   a rotatable cylindrical body having a plurality of device openings dimensioned to receive the plurality of microelectronic devices; and
   a laterally translatable receiving substrate configured to move in a second direction and receive the plurality of microelectronic devices, wherein the cylindrical body is positioned between the laterally translatable carrier substrate and the laterally translatable receiving substrate such that rotation of the cylindrical body aligns the device openings with the plurality of microelectronic devices moving in the first direction and transports the plurality of microelectronic devices within the device openings to the receiving substrate, wherein an opening of the plurality of device openings is configured to move in the first direction, and wherein the first direction is different from the second direction;
   wherein the laterally translatable carrier substrate is configured to move the plurality of microelectronic devices in the first direction and includes a multilayer delivery fluid that supports the microelectronic devices; and
   wherein the multilayer delivery fluid comprises a first flowable fluid and a second flowable fluid that is immiscible with the first flowable fluid.

2. The apparatus of claim 1 wherein the first direction is opposite the second direction.

3. The apparatus of claim 1 wherein the plurality of device openings are each defined in a shape to accommodate one of the plurality of microelectronic devices, the one of the plurality of microelectronic devices is selected from the group consisting of: a photovoltaic solar cell, a detector device and an integrated circuit device.

4. The apparatus of claim 1 wherein the plurality of device openings are configured to simultaneously deposit the plurality of microelectronic devices on the laterally translatable receiving substrate.

5. The apparatus of claim 1 wherein the laterally translatable receiving substrate is a multilayered substrate having insulating layers and conductive layers, wherein the conductive layers are patterned to align with contact pads of the plurality of microelectronic devices.

6. The apparatus of claim 1, wherein the multilayer delivery fluid supports the plurality of microelectronic devices in a desired orientation.

7. The apparatus of claim 1, wherein the laterally translatable receiving substrate comprises a patterned layer having a patterned opening configured to receive the plurality of microelectronic devices.

\* \* \* \* \*